(12) United States Patent
Lim

(10) Patent No.: US 11,025,233 B1
(45) Date of Patent: Jun. 1, 2021

(54) OSCILLATOR CIRCUIT RESISTANT TO NOISE AND JITTER

(71) Applicant: Samsung Electro-Mechanics Co., Ltd., Suwon-si (KR)

(72) Inventor: Tae Ho Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/841,915

(22) Filed: Apr. 7, 2020

(30) Foreign Application Priority Data

Jan. 17, 2020 (KR) .................... 10-2020-0006575

(51) Int. Cl.
*H03K 3/013* (2006.01)
*H03K 3/011* (2006.01)
*H03K 4/502* (2006.01)
*H03K 3/0231* (2006.01)

(52) U.S. Cl.
CPC ............ *H03K 3/013* (2013.01); *H03K 3/011* (2013.01); *H03K 3/0231* (2013.01); *H03K 4/502* (2013.01)

(58) Field of Classification Search
CPC ........ H03K 3/0231; H03K 4/50; H03K 4/501; H03K 4/502; H03K 3/011; H03K 3/013; H03B 5/24
See application file for complete search history.

(56) References Cited

U.S. PATENT DOCUMENTS

| 5,216,291 A | 6/1993 | Seevinck et al. |
| 2016/0079917 A1* | 3/2016 | Holzmann ............ H01L 29/772 331/70 |
| 2018/0167030 A1 | 6/2018 | Wu et al. |

FOREIGN PATENT DOCUMENTS

| KR | 10-1991-0019342 A | 11/1991 | |
| KR | 10-2008-0061217 A | 7/2008 | |
| KR | 10-2018-0022986 A | 3/2018 | |
| WO | WO-2018218450 A1 * | 12/2018 | ............... H03B 5/04 |

* cited by examiner

*Primary Examiner* — Ryan Johnson
(74) *Attorney, Agent, or Firm* — NSIP Law

(57) ABSTRACT

An oscillator circuit includes a bias circuit, a signal generation circuit, and a control circuit. The bias circuit is configured to generate a reference voltage based on a reference current and a bias resistor. The signal generation circuit is configured to generate a bias current based on the reference current, perform charging and discharging of a capacitor using the bias current, and generate an oscillation signal based on the charging and the discharging of the capacitor. The control circuit is configured to generate a control signal having a constant discharging time, based on the reference voltage and the oscillation signal, controlling the charging and the discharging of the capacitor.

19 Claims, 6 Drawing Sheets

OSCILLATOR CIRCUIT RESISTANT TO NOISE AND JITTER

CROSS-REFERENCE TO RELATED APPLICATION(S)

This application claims the benefit under 35 USC 119(a) of Korean Patent Application No. 10-2020-0006575 filed on Jan. 17, 2020, in the Korean Intellectual Property Office, the entire disclosure of which is incorporated herein by reference for all purposes.

BACKGROUND

1. Field

The present disclosure relates to an oscillator circuit resistant to low noise and jitter.

2. Description of Related Art

In general, an oscillator circuit generates an oscillation signal having a period. Here, the period may be determined depending on a voltage or a current. When the voltage and the current vary with temperature, the period of the oscillation signal may change based on the changes in temperature, which may make the oscillation signal become unstable.

For example, in a conventional oscillator circuit having a band gap reference (BGR) circuit, the frequency of an oscillation signal, which is a period, is 'T=CV/I'. The band gap reference (BGR) circuit makes it possible to generate voltage and current that do not vary with temperature changes and, thereby, generates an oscillation signal that has a period independent of temperature.

However, such a conventional oscillator circuit includes a band gap circuit that may be large-sized and high-priced. Thus, there may be problems in that the manufacturing cost is high and there is a limit in reducing the size.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an oscillator circuit includes a bias circuit, a signal generation circuit, and a control circuit. The bias circuit is configured to generate a reference voltage based on a reference current and a bias resistor. The signal generation circuit is configured to generate a bias current based on the reference current, perform charging and discharging of a capacitor using the bias current, and generate an oscillation signal based on the charging and the discharging of the capacitor. The control circuit is configured to generate a control signal having a constant discharging time, based on the reference voltage and the oscillation signal, controlling the charging and the discharging of the capacitor.

A period of the oscillation signal may be determined as a function of a resistance value of the bias resistor and a capacitance of the capacitor.

The bias circuit may include a first current mirroring circuit, a self-bias circuit, and the bias resistor. The first current mirroring circuit, including a first p-channel metal oxide semiconductor (PMOS) and a second PMOS connected to each other in a current mirroring structure, may be configured to generate the reference current. The self-bias circuit, including a first n-channel metal oxide semiconductor (NMOS) and a second NMOS connected to the first current mirroring circuit, may have a gate-source connection and a gate-drain connection. The bias resistor, connected between a source of the first NMOS and a ground, may generate the reference voltage based on the reference current.

The bias circuit may include a first current mirroring circuit, a self-bias circuit, and an isolation circuit. The first current mirroring circuit, including a first PMOS and a second PMOS connected to each other in a current mirroring structure, may be configured to generate the reference current. The self-bias circuit, including a first NMOS and a second NMOS connected to the first current mirroring circuit, may have a gate-source connection and a gate-drain connection. The bias resistor, connected between a source of the first NMOS and a ground, may generate the reference voltage based on the reference current. The isolation circuit, connected to the first current mirroring circuit in a current mirroring structure, may be configured to transmit the reference current to the signal generation circuit and block noise or jitter from the signal generation circuit.

The isolation circuit may include a second current mirroring circuit having a third PMOS connected to the first current mirroring circuit in the current mirroring structure, a third current mirroring circuit, and a fourth current mirroring circuit. The third current mirroring circuit may have a third NMOS connected to the third PMOS in series, and a fourth NMOS connected to the third NMOS in a current mirroring structure between a terminal of a power supply voltage and the ground. The fourth current mirroring circuit may have a fourth PMOS connected to the fourth NMOS in series between the terminal of the power supply voltage and the ground, may be configured to transmit a current flowing through the fourth NMOS to the signal generation circuit.

The signal generation circuit may include an output current mirroring circuit, and a charging and discharging circuit. The output current mirroring circuit may have a fifth PMOS connected to the isolation circuit in a current mirroring structure. The charging and discharging circuit, including the capacitor connected between the fifth PMOS and the ground, may be configured to perform the charging and the discharging based on the bias current flowing through the fifth PMOS and a switch element connected to the capacitor in parallel, perform a switching operation in response to the control signal of the control circuit, and generate the oscillation signal.

The control circuit may include a comparison circuit and a discharging logic circuit. The comparison circuit may be configured to compare the oscillation signal with the reference voltage and output a comparison signal having a level according to a comparison result. The discharging logic circuit may be configured to delay the comparison signal from the comparison circuit by a preset time, invert the delayed signal to generate a delayed inverted signal, and generate the control signal having the constant discharging time using the delayed inverted signal and the comparison signal.

The discharging logic circuit may include a delayer, an inverter, and a logic AND circuit. The delayer may be configured to delay the comparison signal from the comparison circuit by the preset time. The inverter may invert the signal passing through the delayer and output the delayed inverted signal. The logic AND circuit may be configured to perform an AND operation between the comparison signal and the delayed inverted signal to generate the control signal having the constant discharging time.

In the current mirroring structure of the first PMOS and the second PMOS, a gate of the first PMOS may be connected to a gate of the second PMOS.

In another general aspect, an oscillator circuit includes a bias circuit, a signal generation circuit, and a control circuit. The bias circuit is configured to generate a reference voltage based on a reference current. The signal generation circuit, connected to the bias circuit in a current mirroring structure, is configured to generate a bias current based on a current mirroring ratio with respect to the bias circuit, perform charging and discharging using the bias current, and generate an oscillation signal based on the charging and the discharging of the signal generation circuit. The control circuit is configured to generate a control signal having a constant discharging time, based on the reference voltage and the oscillation signal, to control the charging and the discharging of the signal generation circuit.

A period of the oscillation signal may be determined as a function of a resistance value of a bias resistor and a capacitance of a capacitor.

The bias circuit may include a first current mirroring circuit, a self-bias circuit, and the bias resistor. The first current mirroring circuit, including a first p-channel metal oxide semiconductor (PMOS) and a second PMOS connected to each other in a current mirroring structure, may be configured to generate the reference current. The self-bias circuit, including a first n-channel metal oxide semiconductor (NMOS) and a second NMOS connected to the first current mirroring circuit, may have a gate-source connection and a gate-drain connection. The bias resistor, connected between a source of the first NMOS and a ground, may generate the reference voltage based on the reference current.

The bias circuit may include a first current mirroring circuit, a self-bias circuit, a bias resistor, and an isolation circuit. The first current mirroring circuit, including a first PMOS and a second PMOS connected to each other in a current mirroring structure, may be configured to generate the reference current. The self-bias circuit, including a first NMOS and a second NMOS connected to the first current mirroring circuit, may have a gate-source connection and a gate-drain connection. The bias resistor, connected between a source of the first NMOS and a ground, may be configured to generate the reference voltage based on the reference current. The isolation circuit, connected to the first current mirroring circuit in a current mirroring structure, may be configured to transmit the reference current to the signal generation circuit, and block noise or jitter from the signal generation circuit.

The isolation circuit may include a second current mirroring circuit, a third current mirroring circuit, and a fourth current mirroring circuit. The second current mirroring circuit may have a third PMOS connected to the first current mirroring circuit in the current mirroring structure. The third current mirroring circuit may have a third NMOS connected to the third PMOS in series, and a fourth NMOS connected to the third NMOS in a current mirroring structure between a terminal of a power supply voltage and the ground. The fourth current mirroring circuit, having a fourth PMOS connected to the fourth NMOS in series between the terminal of the power supply voltage and the ground, may be configured to transmit a current flowing through the fourth NMOS to the signal generation circuit.

The signal generation circuit may include an output current mirroring circuit having a fifth PMOS connected to the bias circuit in the current mirroring structure and a charging and discharging circuit. The charging and discharging circuit, including a capacitor connected between the fifth PMOS and the ground, may be configured to perform the charging and the discharging based on the bias current flowing through the fifth PMOS and a switch element connected to the capacitor in parallel, perform a switching operation in response to the control signal of the control circuit, and generate the oscillation signal. The control circuit may include a comparison circuit and a discharging logic circuit. The comparison circuit, comparing the oscillation signal with the reference voltage, may be configured to output a comparison signal having a level according to a comparison result. The discharging logic circuit may be configured to delay the comparison signal from the comparison circuit by a preset time, invert the delayed signal to generate a delayed inverted signal, and generate the control signal having the constant discharging time using the delayed inverted signal and the comparison signal.

The discharging logic circuit may include a delayer configured to delay the comparison signal from the comparison circuit by the preset time, an inverter configured to invert the signal passing through the delayer and output the delayed inverted signal, and a logic AND circuit configured to perform an AND operation between the comparison signal and the delayed inverted signal to generate the control signal having the constant discharging time.

In the current mirroring structure of the first PMOS and the second PMOS, a gate of the first PMOS may be connected to a gate of the second PMOS.

In another general aspect, an oscillator circuit includes a bias circuit, a signal generation circuit, and a control circuit. The bias circuit includes a first p-channel metal oxide semiconductor (PMOS) and a second PMOS connected to each other in a current mirroring structure to generate a reference current. A gate of the first PMOS is connected to a gate of the second PMOS, and the bias circuit is configured to generate a reference voltage based on the reference current and a bias resistor. The signal generation circuit is configured to generate a bias current based on the reference current, perform charging and discharging of a capacitor using the bias current, and generate an oscillation signal based on the charging and the discharging of the capacitor. The control circuit is configured to generate a control signal having a constant discharging time, based on the reference voltage and the oscillation signal, controlling the charging and the discharging of the capacitor.

A period of the oscillation signal may be determined as a function of a resistance value of the bias resistor and a capacitance of the capacitor.

Throughout the drawings and the detailed description, the same reference numerals refer to the same elements. The drawings may not be to scale, and the relative size, proportions, and depiction of elements in the drawings may be exaggerated for clarity, illustration, and convenience.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
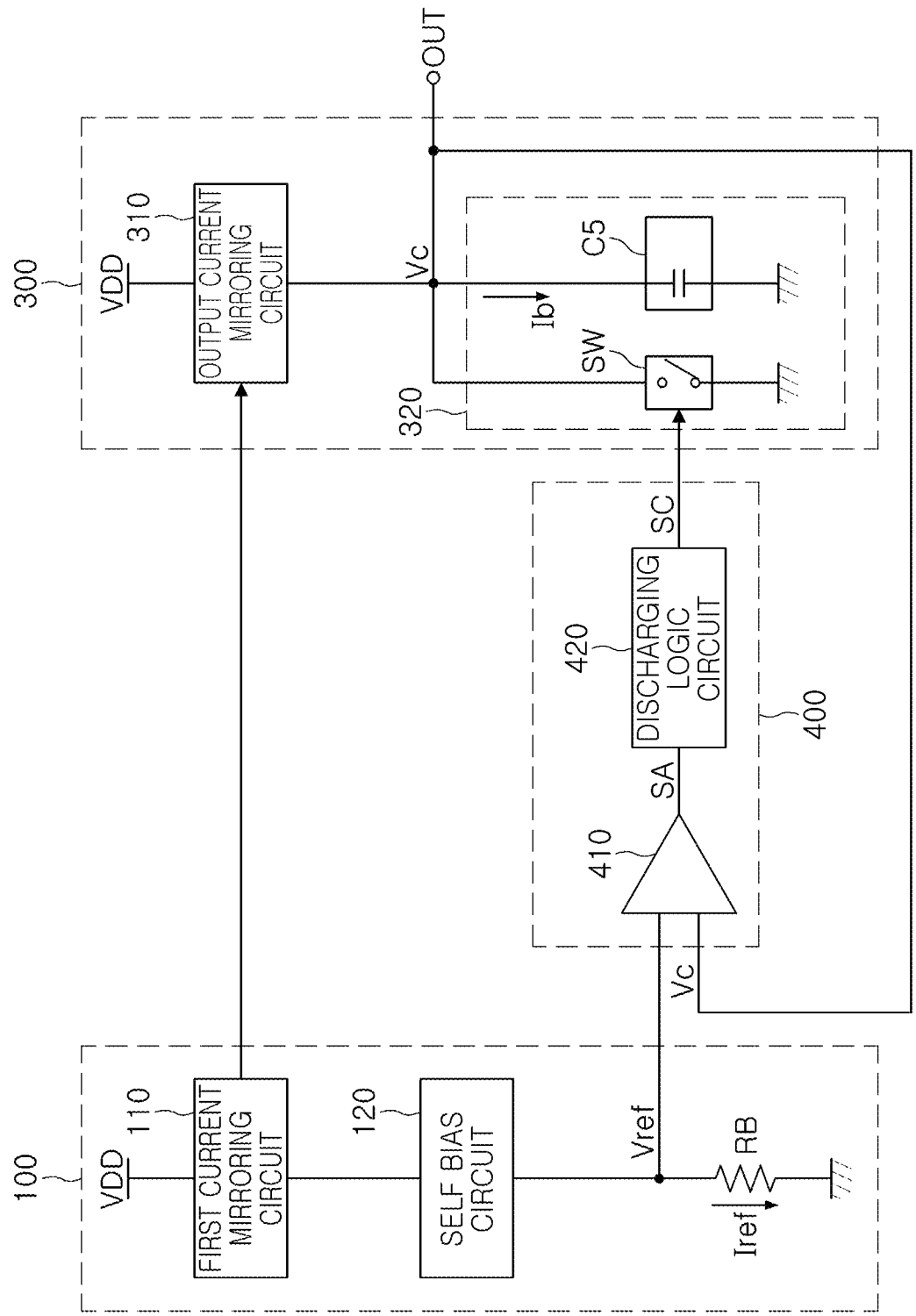
FIG. 1 is a diagram illustrating an example of an oscillator circuit.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating an example of an oscillator circuit.

In FIG. 1, an oscillator circuit may include a bias circuit 100, a signal generation circuit 300, and a control circuit 400. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The bias circuit 100 may generate a reference voltage Vref based on a reference current Iref and a bias resistor RB.

As an example, the bias circuit 100 may include the bias resistor RB and determine the reference voltage Vref based on the reference current Iref and the bias resistor RB.

For example, the bias circuit 100 may include a first current mirroring circuit 110, a self-bias circuit 120, and the bias resistor RB.

The first current mirroring circuit 110 and the self-bias circuit 120 may generate the reference current Iref.

The bias resistor RB may generate the reference voltage Vref based on the reference current Iref.

The signal generation circuit 300 may generate a bias current Ib based on the reference current Iref, perform charging and discharging of a capacitor C5 using the bias current Ib, and generate an oscillation signal Vc based on the charging and discharging of the capacitor C5.

As an example, the signal generation circuit 300 may include an output current mirroring circuit 310 and a charging and discharging circuit 320.

The output current mirroring circuit 310 may be connected to the first current mirroring circuit 110, in a current mirroring structure, to generate the bias current Ib based on the reference current Iref.

The charging and discharging circuit 320 may perform the charging and the discharging on the capacitor C5 using the bias current Ib, and generate the oscillation signal Vc based on the charging and the discharging.

As an example, the charging and discharging circuit 320 may include the capacitor C5 and a switch element SW. The capacitor C5 and the switch element SW may operate to perform the charging and the discharging based on the bias current Ib.

For example, the switch element SW of the charging and discharging circuit 320 may be switched off, i.e., opened, in response to a control signal SC input from the control circuit 400. In this case, the capacitor C5 may operate to be charged. When the switch element SW of the charging and discharging circuit 320 is switched on, i.e., closed, in response to the control signal SC of the control circuit 400, the capacitor C5 may operate to be discharged.

As an example, the signal generation circuit 300 may include the capacitor C5 to be charged using the bias current Ib and determine a period T of the oscillation signal Vc based on the bias resistor RB and the capacitor C5.

The control circuit 400 may generate the control signal SC having a constant discharging time, based on the reference voltage Vref and the oscillation signal Vc, to control the charging and the discharging.

For example, the control circuit 400 may include a comparison circuit 410 and a discharging logic circuit 420.

The comparison circuit 410 may compare the oscillation signal Vc with the reference voltage Vref and output a comparison signal SA having a level according to a comparison result.

As an example, as a result of comparing the oscillation signal Vc with the reference voltage Vref, the comparison circuit 410 may generate a control signal SC having an off level when a voltage magnitude of the oscillation signal Vc is smaller than that of the reference voltage Vref, and generate a control signal SC having an on level when the voltage magnitude of the oscillation signal Vc is greater than that of the reference voltage Vref.

The discharging logic circuit 420 may generate the control signal SC having the constant discharging time using the comparison signal SA from the comparison circuit 410.

The period T of the oscillation signal Vc may be determined depending on a resistance value of the bias resistor RB and a capacitance of the capacitor C5.

In the respective drawings in the present disclosure, unnecessarily overlapping descriptions may be omitted for components denoted by the same reference marks, and having the same functions, and differences in the respective drawings will be described.

Figure 2:
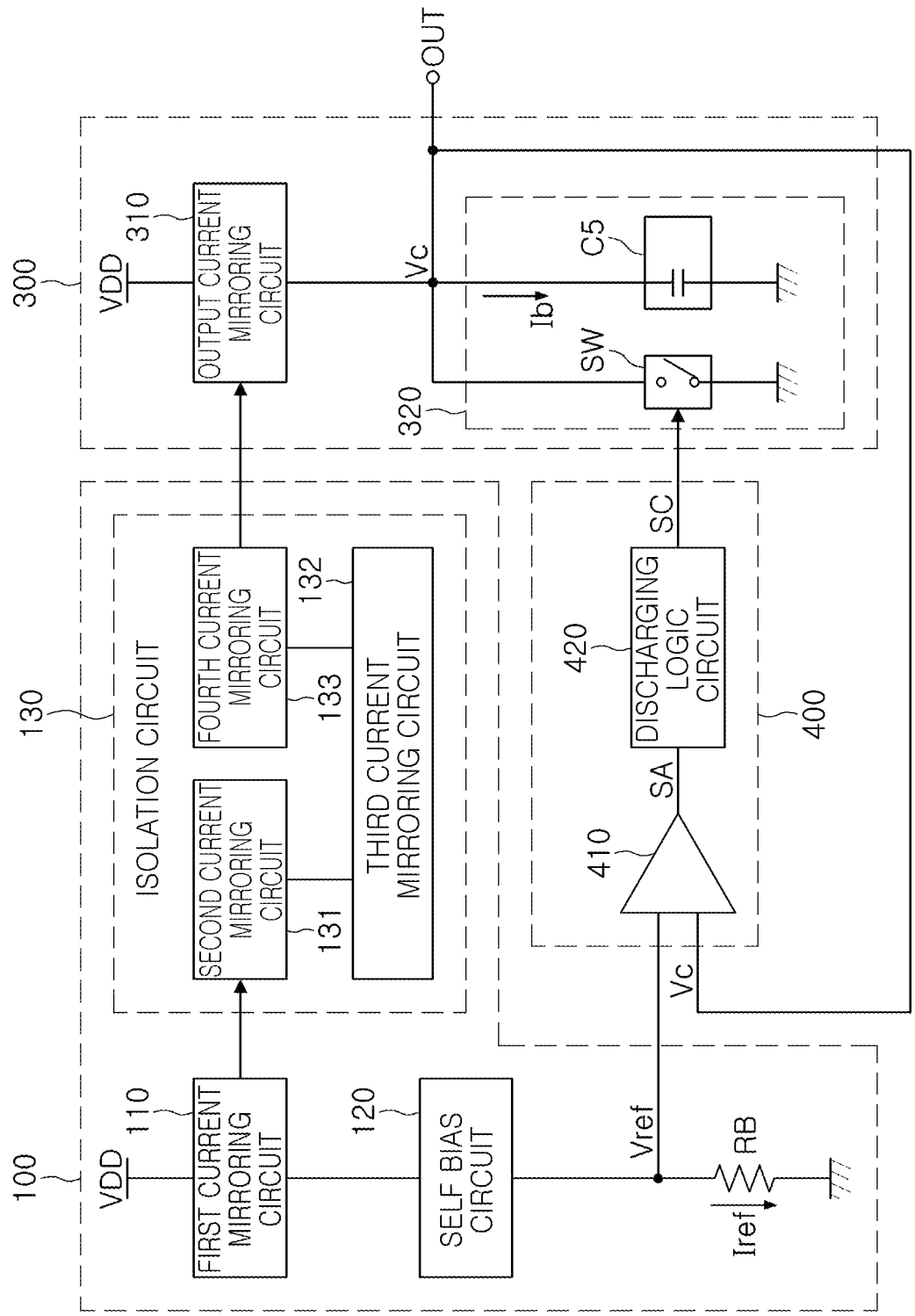
FIG. 2 is a diagram illustrating an example of an oscillator circuit.

FIG. 2 is a diagram illustrating an example of an oscillator circuit. The description of the oscillator circuit of FIG. 2 overlapping with that of FIG. 1 will be omitted, and the following description will focus on the differences of the oscillator circuit of FIG. 2 from that of FIG. 1.

In FIG. 2, the bias circuit 100 may further include an isolation circuit 130.

The isolation circuit 130 may be connected between the first current mirroring circuit 110 and the signal generation circuit 300, while being connected to the first current mirroring circuit 110 in a current mirroring structure to transmit the reference current Iref to the signal generation circuit 300, and may block noise or jitter from the signal generation circuit 300.

As an example, the isolation circuit 130 may include a second current mirroring circuit 131, a third current mirroring circuit 132, and a fourth current mirroring circuit 133.

In FIGS. 1 and 2, the signal generation circuit 300 may include an output current mirroring circuit 310 and a charging and discharging circuit 320.

Figure 3:
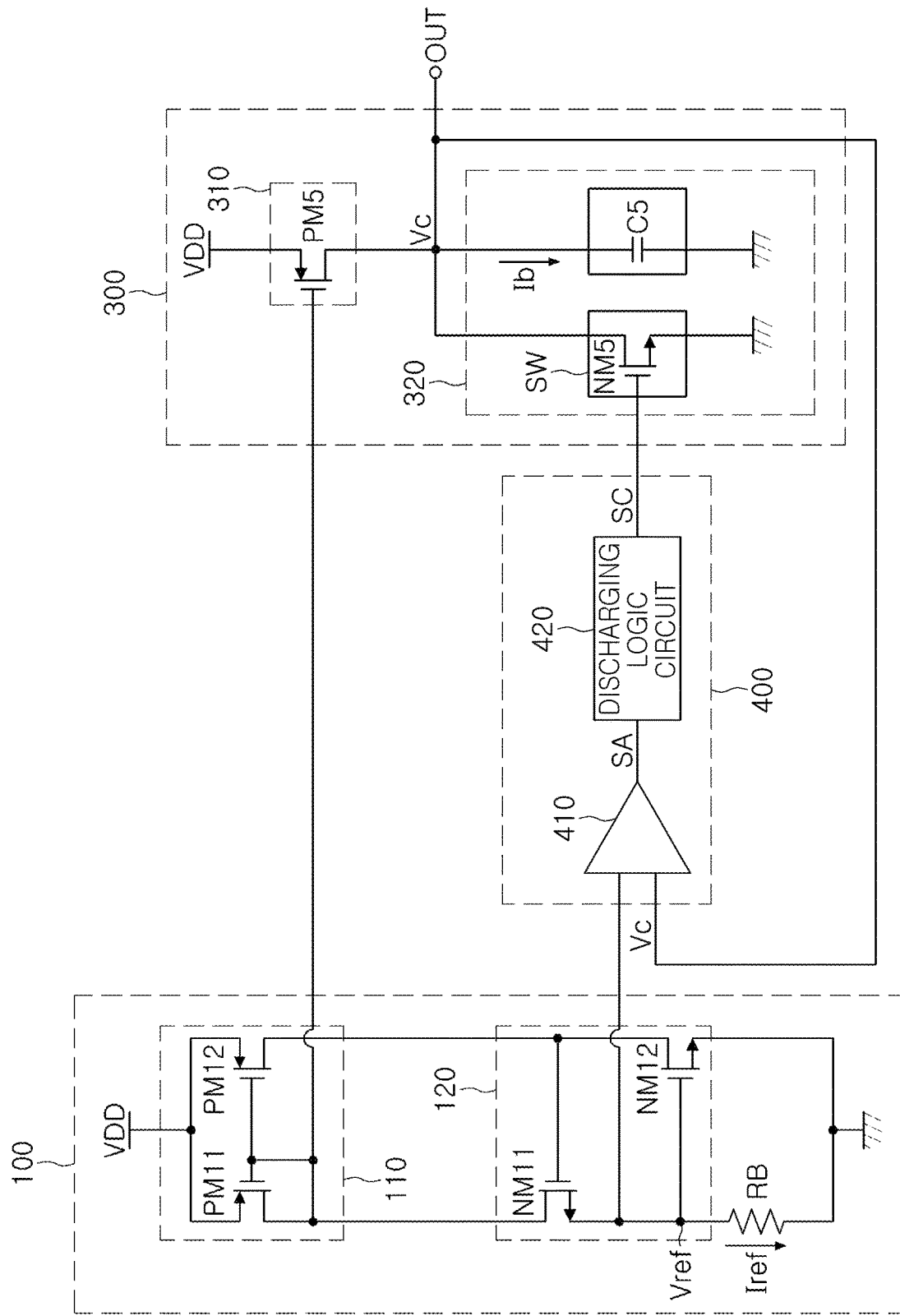
FIG. 3 is a diagram illustrating an internal circuit of the oscillator circuit of FIG. 1.
Figure 4:
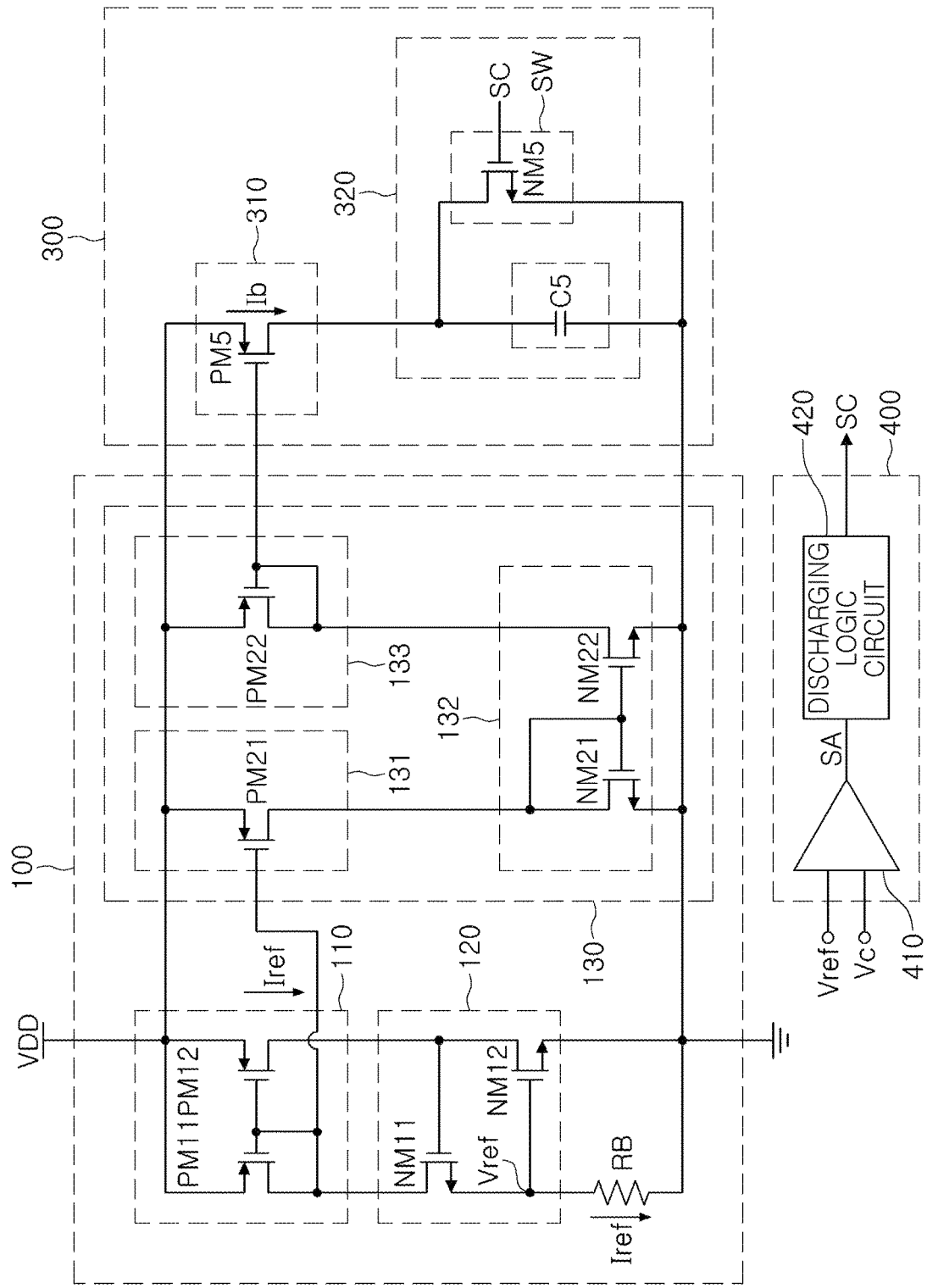
FIG. 4 is a diagram illustrating an internal circuit of the oscillator circuit of FIG. 2.

As an example, the output current mirroring circuit 310 may include a p-channel metal oxide semiconductor (PMOS) PM5 connected to the first current mirroring circuit 110 in the current mirroring structure (see FIGS. 3 and 4).

As an example, the charging and discharging circuit 320 may include the capacitor C5 and the switch element SW, connected to each other in parallel.

The control circuit 400 may include a comparison circuit 410 and a discharging logic circuit 420.

The comparison circuit 410 may compare the oscillation signal Vc with the reference voltage Vref and output the comparison signal SA having a level according to a comparison result.

The discharging logic circuit 420 may generate the control signal SC having a constant discharging time, based on the comparison signal SA from the comparison circuit 410.

The signal generation circuit 300 may be connected to the bias circuit 100 in the current mirroring structure. The signal generation circuit 300 may generate a bias current Ib based on a current mirroring ratio with respect to the bias circuit 100, perform charging and discharging using the bias current Ib, and generate an oscillation signal Vc based on the charging and the discharging.

FIG. 3 is a diagram illustrating an internal circuit of the oscillator circuit of FIG. 1. FIG. 4 is a diagram illustrating an internal circuit of the oscillator circuit of FIG. 2.

In FIGS. 3 and 4, the first current mirroring circuit 110 may include a first PMOS PM11 and a second PMOS PM12, connected to a terminal of a power supply voltage VDD and connected to each other in a current mirroring structure, and may generate the reference current Iref. The first PMOS PM11 may have a gate-drain connection structure.

The self-bias circuit 120 may include a first n-channel metal oxide semiconductor (NMOS) NM11 and a second NMOS NM12 connected to the first current mirroring circuit 110. A gate of the first NMOS NM11 and a drain of the second NMOS NM12 may be connected to each other. A source of the first NMOS NM11 and a gate of the second NMOS NM12 may be connected to each other. The source of the first NMOS NM11 and the gate of the second NMOS NM12 may be connected to the bias resistor RB, and a source of the second NMOS NM12 may be connected to a ground.

The bias resistor RB may be connected between the source of the first NMOS NM11 and the ground, and may generate the reference voltage Vref based on the reference current Iref.

As an example, the output current mirroring circuit 310 may include the PMOS PM5, connected to the first current mirroring circuit 110 in the current mirroring structure having a current mirroring ratio. For example, the output current mirroring circuit 310 may generate the bias current Ib that is current-mirrored from the reference current Iref based on a size ratio of the output PMOS PM5 to the first PMOS PM11 of the bias circuit 110.

As an example, the switch element SW of the charging and discharging circuit 320 may include an output NMOS NM5 performing a switching operation according to the control signal SC.

The capacitor C5 may operate to be charged and discharged according to the switching operation of the output NMOS NM5, based on the bias current Ib flowing through the output PMOS PM5.

Accordingly, the charging and discharging circuit 320 may generate an oscillation signal Vc.

In FIG. 4, the first current mirroring circuit 110 of the bias circuit 100 may include the first PMOS PM11 and the second PMOS PM12, connected to each other in a current mirroring structure, and generate the reference current Iref.

The self-bias circuit 120 of the bias circuit 100 may include the first NMOS NM11 and the second NMOS NM12, connected to the first current mirroring circuit 110, and having a gate-source connection and a gate-drain connection.

The bias resistor RB of the bias circuit 100 may be connected between the source of the first NMOS NM11 and the ground, and may generate the reference voltage Vref based on the reference current Iref.

The isolation circuit 130 may be connected to the first current mirroring circuit 110 in a current mirroring structure to transmit the reference current Iref to the signal generation circuit 300, and may block noise or jitter from the signal generation circuit 300.

In FIGS. 2 and 4, the isolation circuit 130 may include the second current mirroring circuit 131, the third current mirroring circuit 132, and the fourth current mirroring circuit 133.

The second current mirroring circuit 131 may include a third PMOS PM21 connected to the first current mirroring circuit 110 in the current mirroring structure.

As an example, the third PMOS PM21 may be set to have a current mirroring ratio with respect to the first PMOS PM11 of the first current mirroring circuit 110. The third current mirroring circuit 132 may include a third NMOS NM21, connected to the third PMOS PM21 in series, and a fourth NMOS NM22, connected to the third NMOS NM21 in a current mirroring structure, between the terminal of the power supply voltage VDD and the ground.

The fourth current mirroring circuit 133 may include a fourth PMOS PM22, connected to the fourth NMOS NM22 in series, between the terminal of the power supply voltage VDD and the ground, to transmit a current flowing through the fourth NMOS NM22 to the signal generation circuit 300.

The period T of the oscillation signal Vc may be determined by multiplying a resistance value Rv of the bias resistor RB by a capacitance Cv of the capacitor C5 (Rv×Cv).

Figure 5:
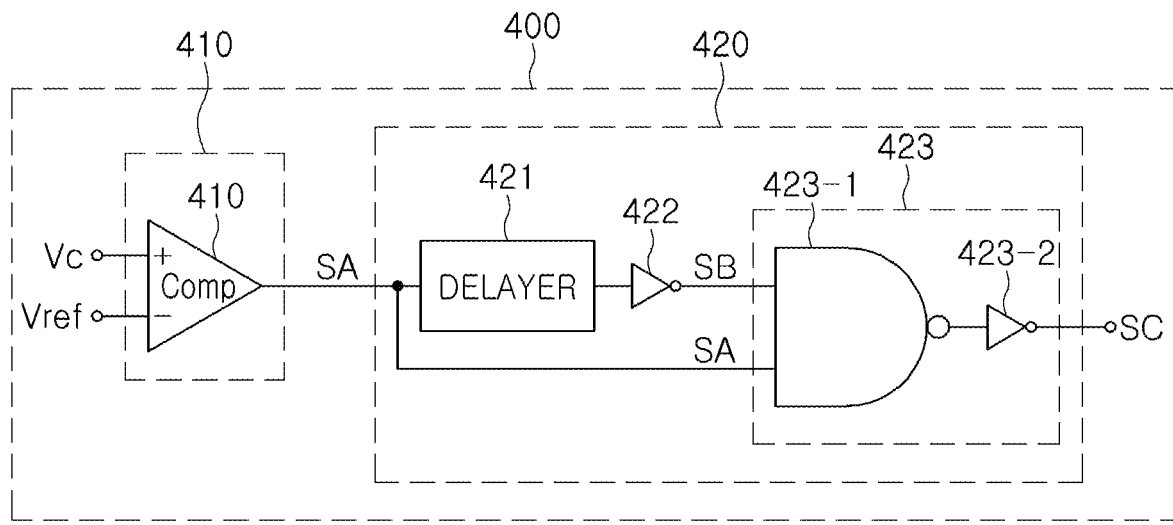
FIG. 5 is a diagram illustrating an example of an internal circuit of a control circuit.

FIG. 5 is a diagram illustrating an example of an internal circuit of the control circuit.

In FIG. 5, the control circuit 400 may include a comparison circuit 410 and a discharging logic circuit 420, as described above.

The comparison circuit 410 may include a comparator Comp. The comparator Comp may compare the oscillation signal Vc with the reference voltage Vref and output the comparison signal SA having a level according to a comparison result.

The discharging logic circuit 420 may delay the comparison signal SA from the comparison circuit 410 by a preset time, invert the delayed signal to generate a delayed inverted signal SB, and generate the control signal SC having the constant discharging time using the delayed inverted signal SB and the comparison signal SA.

For example, the discharging logic circuit 420 may include a delayer 421, an inverter 422, and a logic AND circuit 423.

The delayer 421 may delay the comparison signal SA from the comparison circuit 410 by the preset time.

The inverter 422 may invert the signal passing through the delayer 421 and output the delayed inverted signal SB.

The logic AND circuit 423 may perform an AND operation between the comparison signal SA and the delayed inverted signal SB to generate the control signal SC having the constant discharging time.

As an example, the logic AND circuit 423 may include one AND gate. As another example, the logic AND circuit 423 may include a NAND gate 423-1 and an inverter 423-2.

Figure 6:
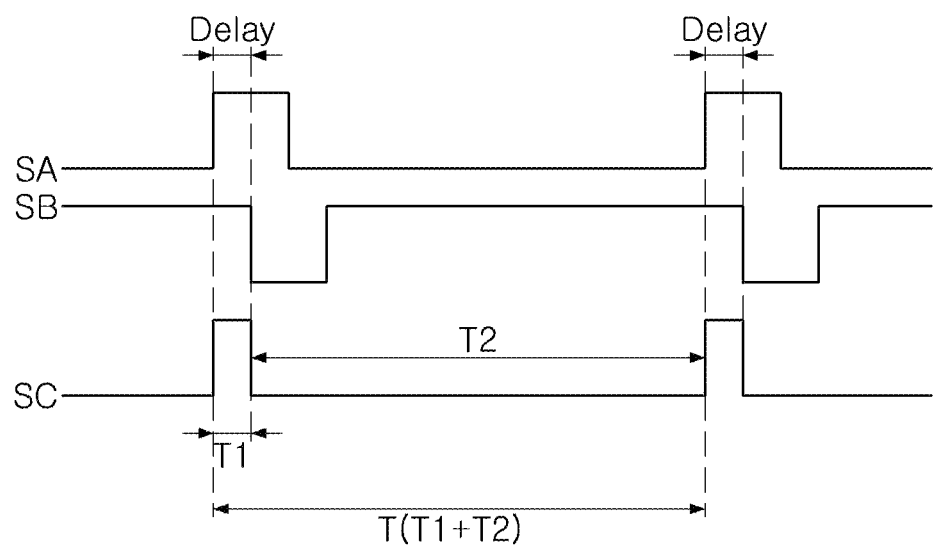
FIG. 6 is a diagram illustrating a time chart for main signals of FIG. 4.

FIG. 6 is a diagram illustrating a time chart for the main signals of FIG. 4.

In FIG. 6, SA is a comparison signal output from the comparison circuit 410, SB is a delayed inverted signal output from the delayer 421, and SC is a control signal output from the logic AND circuit 423.

In FIG. 6, the control signal SC may remain at a high level for a time corresponding to a delay time T1 preset by the delayer 421 in order to maintain a constant discharging time independent of a change in temperature.

In FIGS. 1 to 6, the period T of the oscillation signal Vc may be determined by multiplying a resistance value Rv of the bias resistor RB by a capacitance Cv of the capacitor C5 (Rv×Cv).

In FIGS. 1 to 6, the period T of the oscillation signal Vc may be determined by multiplying a resistance value RV of the bias resistor RB by a capacitance CV of the capacitor C5 (RV×CV).

In further detail, in the oscillator circuit, the total amount of charge Q with which the capacitor C5 is charged may be obtained by multiplying a capacitance Cv by a voltage V and represented by the following Equation 1.

$$Q = Cv \times V \qquad \text{Equation 1:}$$

In the oscillator circuit, a current I flowing in the capacitor C5 may be represented by the following Equation 2.

$$I = Q/(T1+T2) \approx (Cv \times V)/T1 \text{ (if } T1 \gg T2, T \approx T1\text{), that is}, T1 \approx (Cv \times V)/I \qquad \text{Equation 2:}$$

In Equations 1 and 2, the period T illustrated in FIG. 6 is 'T1+T2'. Here, T1 is much larger than T2 (T1≫T2). If T2 can be ignored, the period T may be approximately the same as T1.

In order to express the period T of Equation 2 as a function where V and I are not relevant to a temperature, V=Vref=Iref×RB and I=Iref may be applied to Equation 2. As a result, Equation 3 described below may be obtained.

$$T1 = (Cv \times V)/I = [Cv \times (Iref \times Rv)]/[Iref] = Cv \times Rv. \qquad \text{Equation 3:}$$

In Equation 3, Cv is a capacitance of the capacitor C5, and Rv is a resistance value of the bias resistor RB.

In Equation 3, the period T (=T1) may be expressed as the product of the capacitance Cv of the capacitor C5 and the resistance value Rv of the bias resistor RB. Here, it may be seen that the period T is determined by constant terms that are independent of temperature. Thus, in the oscillator circuit of the present disclosure, the period may be a frequency function where a power supply voltage and a temperature are independent of each other.

Figure 7:
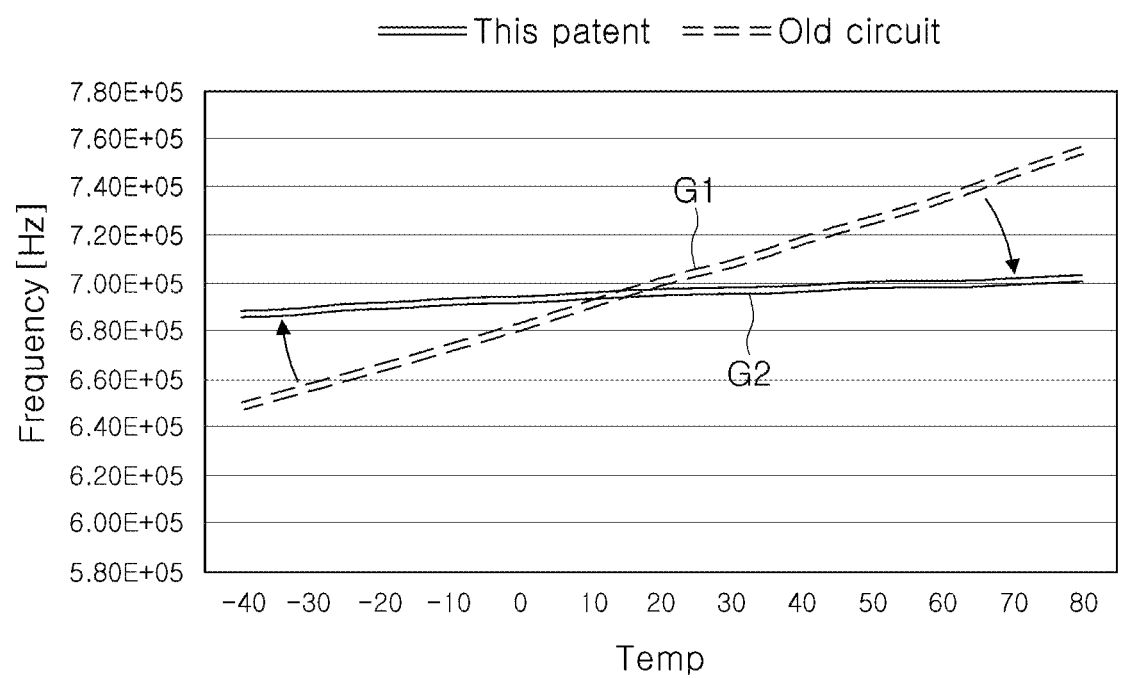
FIG. 7 is a graph illustrating a relationship between a temperature and an oscillation frequency.

FIG. 7 is a graph illustrating a relationship between a temperature and an oscillation frequency.

In FIG. 7, G1 is a graph of a relationship between a temperature and an oscillation frequency in a conventional oscillator circuit, and G2 is a graph of a relationship between a temperature and an oscillation frequency in an oscillator circuit according to the present disclosure.

Referring to G1 and G2 of FIG. 7, it may be seen, from the graph G2 of a relationship between temperature and oscillation frequency in an oscillator circuit of the present disclosure, that the disclosed oscillator circuit is insensitive to changes in temperature, thereby, enabling a more stable oscillation operation.

As set forth above, according to the examples in the present disclosure, adverse influence of noise and jitter can be reduced. In addition, temperature and voltage-independent oscillation signals can be generated without a band gap reference circuit.

Furthermore, an oscillation operation can be performed independent of temperature, thereby, reducing the rate of change based on temperature and reducing changes in the output frequency.

Accordingly, a more stable timing margin can be achieved, mass productivity can be increased, and circuit stability can also be increased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An oscillator circuit comprising:
    a bias circuit configured to generate a reference voltage based on a reference current and a bias resistor;
    a signal generation circuit configured to generate a bias current based on the reference current, perform charging and discharging of a capacitor using the bias current, and generate an oscillation signal based on the charging and the discharging of the capacitor; and
    a control circuit configured to generate a control signal having a constant discharging time based on the reference voltage and the oscillation signal, the control signal being configured to control the charging and the discharging of the capacitor,
    wherein the bias circuit comprises:
        a first current mirroring circuit configured to generate the reference current and comprising a first p-channel metal oxide semiconductor (PMOS) and a second PMOS connected to each other in a current mirroring structure;
        a self-bias circuit connected to the first current mirroring circuit and comprising a first n-channel metal oxide semiconductor (NMOS) and a second NMOS, a gate of the first NMOS being connected to a drain of the second NMOS, and a gate of the second NMOS being connected to a source of the first NMOS; and
        the bias resistor, the bias resistor being connected between the source of the first NMOS and a ground and being configured to generate the reference voltage based on the reference current,
    the signal generation circuit comprises a charging and discharging circuit comprising a switch element configured to open and close in response to the control signal to control the charging and the discharging of the capacitor and generate the oscillation signal, and
    the signal generation circuit is further configured so that the bias current flows into the capacitor to charge the capacitor while the switch element is open, and the bias current and a discharge current from the capacitor flow through the switch element to discharge the capacitor while the switch element is closed.

2. The oscillator circuit of claim 1, wherein a period of the oscillation signal is approximately equal to a product of a resistance value of the bias resistor and a capacitance value of the capacitor.

3. The oscillator circuit of claim 1, wherein the bias circuit further comprises:
    an isolation circuit connected to the first current mirroring circuit in a current mirroring structure, the isolation circuit being configured to transmit the reference current to the signal generation circuit and block noise or jitter from the signal generation circuit.

4. The oscillator circuit of claim 3, wherein the isolation circuit comprises:
    a second current mirroring circuit comprising a third PMOS connected to the first current mirroring circuit in a current mirroring structure;
    a third current mirroring circuit comprising a third NMOS connected to the third PMOS in series between a power supply voltage terminal and the ground, and a fourth NMOS connected to the third NMOS in a current mirroring structure; and
    a fourth current mirroring circuit comprising a fourth PMOS connected to the fourth NMOS in series between the power supply voltage terminal and the ground, the fourth current mirroring circuit being configured to transmit a current flowing through the fourth NMOS to the signal generation circuit as the reference current.

5. The oscillator circuit of claim 1, wherein the signal generation circuit further comprises an output current mirroring circuit comprising a PMOS connected to the first current mirroring circuit of the bias circuit in a current mirroring structure, the PMOS of the output current mirroring circuit being configured to generate the bias current based on the reference current,
    the charging and discharging circuit further comprises the capacitor, the capacitor being directly connected between the PMOS of the output current mirroring circuit and the ground,
    the switch element is directly connected in parallel with the capacitor between the PMOS of the output current mirroring circuit and the ground, and
    the signal generation circuit is further configured so that the bias current flows from the PMOS of the output current mirroring circuit into the capacitor to charge the capacitor while the switch element is open, and the bias current flows from the PMOS of the output current mirroring circuit through the switch element to the ground while the switch is closed and a discharge current flows from the capacitor through the switch element to the ground while the switch element is closed to discharge the capacitor while the switch element is closed.

6. The oscillator circuit of claim 1, wherein the control circuit comprises:
    a comparison circuit configured to compare the oscillation signal with the reference voltage and output a comparison signal having a level according to a result of the comparison; and
    a discharging logic circuit configured to delay the comparison signal output from the comparison circuit by a preset time to generate a delayed signal, invert the delayed signal to generate a delayed inverted signal, and generate the control signal having the constant discharging time using the delayed inverted signal and the comparison signal.

7. The oscillator circuit of claim 6, wherein the discharging logic circuit comprises:
   a delayer configured to delay the comparison signal output from the comparison circuit by the preset time to generate the delayed signal;
   an inverter configured to invert the delayed signal generated by the delayer to generate the delayed inverted signal; and
   a logic AND circuit configured to perform an AND operation between the comparison signal and the delayed inverted signal to generate the control signal having the constant discharging time.

8. The oscillator circuit of claim 1, wherein a gate of the first PMOS is connected to a gate of the second PMOS.

9. The oscillator circuit of claim 1, wherein a drain of the first NMOS of the self-bias circuit is connected to a drain of the first PMOS of the first current mirroring circuit, and
   the drain of the second NMOS of the self-bias circuit is connected to a drain of the second PMOS of the first current mirroring circuit.

10. An oscillator circuit comprising:
    a bias circuit configured to generate a reference voltage based on a reference current;
    a signal generation circuit connected to the bias circuit in a current mirroring structure, the signal generation circuit being configured to generate a bias current based on a current mirroring ratio with respect to the bias circuit, perform charging and discharging using the bias current, and generate an oscillation signal based on the charging and the discharging performed by the signal generation circuit; and
    a control circuit configured to generate a control signal having a constant discharging time based on the reference voltage and the oscillation signal, the control signal being configured to control the charging and the discharging performed by the signal generation circuit,
    wherein the bias circuit comprises:
       a first current mirroring circuit configured to generate the reference current and comprising a first p-channel metal oxide semiconductor (PMOS) and a second PMOS connected to each other in a current mirroring structure;
       a self-bias circuit connected to the first current mirroring circuit and comprising a first n-channel metal oxide semiconductor (NMOS) and a second NMOS, a gate of the first NMOS being connected to a drain of the second NMOS, and a gate of the second NMOS being connected to a source of the first NMOS; and
       the bias resistor, the bias resistor being connected between the source of the first NMOS and a ground and being configured to generate the reference voltage based on the reference current,
    the signal generation circuit comprises a charging and discharging circuit comprising a switch element configured to open and close in response to the control signal to control the charging and the discharging and generate the oscillation signal, and
    the signal generation circuit is further configured so that the bias current performs the charging while the switch element is open, and the bias current and a discharge current flow through the switch element to perform the discharging while the switch element is closed.

11. The oscillator circuit of claim 10, wherein a period of the oscillation signal is approximately equal to a product of a resistance value of the bias resistor and a capacitance value of a capacitor.

12. The oscillator circuit of claim 10, wherein the bias circuit further comprises:
    an isolation circuit connected to the first current mirroring circuit in a current mirroring structure, the isolation circuit being configured to transmit the reference current to the signal generation circuit and block noise or jitter from the signal generation circuit.

13. The oscillator circuit of claim 12, wherein the isolation circuit comprises:
    a second current mirroring circuit comprising a third PMOS connected to the first current mirroring circuit in a current mirroring structure;
    a third current mirroring circuit comprising a third NMOS connected to the third PMOS in series between a power supply voltage terminal and the ground, and a fourth NMOS connected to the third NMOS in a current mirroring structure; and
    a fourth current mirroring circuit comprising a fourth PMOS connected to the fourth NMOS in series between the power supply voltage terminal and the ground, the fourth current mirroring circuit being configured to transmit a current flowing through the fourth NMOS to the signal generation circuit as the reference current.

14. The oscillator circuit of claim 10, wherein the signal generation circuit further comprises an output current mirroring circuit comprising a PMOS connected to the first current mirroring circuit of the bias circuit in a current mirroring structure, the PMOS of the output current mirroring circuit being configured to generate the bias current based on the reference current,
    the charging and discharging circuit further comprises a capacitor directly connected between the PMOS of the output current mirroring circuit and the ground,
    the switch element is directly connected in parallel with the capacitor between the PMOS of the output current mirroring circuit and the ground, and
    the signal generation circuit is further configured so that the bias current flows from the PMOS of the output current mirroring circuit into the capacitor to charge the capacitor while the switch element is open, and the bias current flows from the PMOS of the output current mirroring circuit through the switch element to the ground while the switch is closed and a discharge current flows from the capacitor through the switch element to the ground while the switch element is closed to discharge the capacitor while the switch element is closed.

15. The oscillator circuit of claim 10, wherein the control circuit comprises:
    a comparison circuit configured to compare the oscillation signal with the reference voltage and output a comparison signal having a level according to a result of the comparison; and
    a discharging logic circuit configured to delay the comparison signal output from the comparison circuit by a preset time to generate a delayed signal, invert the delayed signal to generate a delayed inverted signal, and generate the control signal having the constant discharging time using the delayed inverted signal and the comparison signal.

16. The oscillator circuit of claim 15, wherein the discharging logic circuit comprises:

a delayer configured to delay the comparison signal from the comparison circuit by the preset time to generate the delayed signal;

an inverter configured to invert the delayed signal generated by the delayer to generate the delayed inverted signal; and a logic AND circuit configured to perform an AND operation between the comparison signal and the delayed inverted signal to generate the control signal having the constant discharging time.

17. The oscillator circuit of claim 10, wherein a gate of the first PMOS is connected to a gate of the second PMOS.

18. An oscillator circuit comprising:

a bias circuit configured to generate a reference voltage based on a reference current and a bias resistor;

a signal generation circuit configured to generate a bias current based on the reference current, perform charging and discharging of a capacitor using the bias current, and generate an oscillation signal based on the charging and the discharging of the capacitor; and a control circuit configured to generate a control signal having a constant discharging time based on the reference voltage and the oscillation signal, the control signal being configured to control the charging and the discharging of the capacitor, wherein the bias circuit comprises:

a current mirroring circuit configured to generate the reference current and comprising a first p-channel metal oxide semiconductor (PMOS) and a second PMOS connected to each other in a current mirroring structure, a gate of the first PMOS being connected to a gate of the second PMOS;

a self-bias circuit connected to the current mirroring circuit and comprising a first n-channel metal oxide semiconductor (NMOS) and a second NMOS, a gate of the first NMOS being connected to a drain of the second NMOS, and a gate of the second NMOS being connected to a source of the first NMOS; and the bias resistor, the bias resistor being connected between the source of the first NMOS and a ground and being configured to generate the reference voltage based on the reference current, the signal generation circuit comprises a charging and discharging circuit comprising a switch element configured to open and close in response to the control signal to control the charging and the discharging of the capacitor and generate the oscillation signal, and the signal generation circuit is further configured so that the bias current flows into the capacitor to charge the capacitor while the switch element is open, and the bias current and a discharge current from the capacitor flow through the switch element to discharge the capacitor while the switch element is closed.

19. The oscillator circuit of claim 18, wherein a period of the oscillation signal is approximately equal to a product of a resistance value of the bias resistor and a capacitance value of the capacitor.

* * * * *